(12) United States Patent
Wagner et al.

(10) Patent No.: US 6,986,384 B2
(45) Date of Patent: Jan. 17, 2006

(54) COOLING APPARATUS FOR DISSIPATING HEAT FROM A HEAT SOURCE

(75) Inventors: Guy R. Wagner, Loveland, CO (US); Chandrakant D. Patel, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 142 days.

(21) Appl. No.: 10/208,065

(22) Filed: Jul. 30, 2002

(65) Prior Publication Data

US 2002/0185263 A1 Dec. 12, 2002

Related U.S. Application Data

(63) Continuation of application No. 09/376,627, filed on Aug. 18, 1999, now abandoned.

(51) Int. Cl.
*F28D 15/00* (2006.01)
*F28D 15/02* (2006.01)
*H05K 7/20* (2006.01)

(52) U.S. Cl. .............................. 165/104.33; 165/80.3; 165/104.21; 165/185; 165/121; 361/700; 361/697; 257/722; 257/715

(58) Field of Classification Search .............. 165/80.3, 165/104.33, 104.21, 185, 121–125; 361/700, 361/704, 687, 699, 695–697; 287/722, 714, 287/715
See application file for complete search history.

(56) References Cited

U.S. PATENT DOCUMENTS

| | | | | |
|---|---|---|---|---|
| 4,012,770 A | * | 3/1977 | Pravda et al. .......... 165/104.33 |
| 5,198,889 A | * | 3/1993 | Hisano et al. .............. 257/678 |
| 5,526,875 A | * | 6/1996 | Lin ............................ 165/80.3 |
| 5,529,115 A | * | 6/1996 | Paterson ................ 165/104.33 |
| 5,785,116 A | * | 7/1998 | Wagner ..................... 165/80.3 |
| 5,871,043 A | * | 2/1999 | Osakabe et al. ....... 165/104.33 |
| 5,992,511 A | * | 11/1999 | Kodaira et al. ............ 165/80.3 |
| 6,067,227 A | * | 5/2000 | Katsui et al. ............... 361/695 |
| 6,082,443 A | * | 7/2000 | Yamamoto et al. ..... 165/104.26 |
| 6,109,340 A | * | 8/2000 | Nakase et al. ............. 165/80.3 |
| 6,253,829 B1 | * | 7/2001 | Mashiko et al. ............ 164/109 |

FOREIGN PATENT DOCUMENTS

| | | | |
|---|---|---|---|
| JP | 09-210582 | * | 8/1997 |
| JP | 11-83355 | * | 3/1999 |

OTHER PUBLICATIONS

Holman, J. P. "Heat Transfer", Third Edition, McGraw Hill, 1972. pp. 37-41.*

* cited by examiner

*Primary Examiner*—John K. Ford

(57) ABSTRACT

A cooling device primarily for cooling, e.g., integrated circuits or other electronic devices during operation may include a heat sink portion having a plurality of cooling vanes and a heat pipe chamber. Both the cooling vanes and the heat pipe chamber may be integrally formed within the heat sink portion. Because the heat pipe chamber is integrally formed with the cooling vanes, no joints exist between the condensing surface of the heat pipe chamber and the cooling vanes. This, in turn, allows extremely rapid and efficient heat transfer between the heat pipe chamber and the cooling vanes. The cooling device may include extensions of the main heat pipe chamber which project into each of the cooling vanes. In this manner, the condensing surface of the heat pipe chamber is actually moved into the vanes at a position very close to the surface of the vanes where heat transfer into the atmosphere occurs.

6 Claims, 3 Drawing Sheets

COOLING APPARATUS FOR DISSIPATING HEAT FROM A HEAT SOURCE

This is a continuation of application Ser. No. 09/376,627 filed Aug. 18, 1999, abandoned, which is hereby incorporated by reference for all that is disclosed therein.

FIELD OF THE INVENTION

The present invention relates generally to cooling devices and, more particularly, to cooling devices for removing heat from an electronic devices.

BACKGROUND OF THE INVENTION

It is often necessary to remove heat from heat sources. One example of a heat source is an electronic device. Electronic devices, such as integrated circuit devices, are increasingly being used in modern applications. One prevalent example is the computer. The central processing unit or units of most computers, including personal computers, is constructed from an integrated circuit device.

During normal operation, electronic devices generate significant amounts of heat. If this heat is not continuously removed, the electronic device may overheat, resulting in damage to the device and/or a reduction in operating performance. In order to avoid such overheating, various types of cooling devices have been developed for use in conjunction with electronic devices.

One type of cooling device is a heat sink cooling device. In such a device, a heat sink is formed of a material, such as aluminum, which readily conducts heat. The heat sink is usually placed on top of and in contact with the electronic device. Due to this contact, heat generated by the electronic device is conducted into the heat sink and away from the electronic device.

The heat sink may include a plurality of cooling fins in order to increase the surface area of the heat sink and, thus, maximize the transfer of heat from the heat sink into the surrounding air. In this manner, the heat sink draws heat away from the electronic device and transfers the heat into the surrounding air. An example of a heat sink is disclosed in U.S. Pat. No. 5,794,685 of Dean for HEAT SINK DEVICE HAVING RADIAL HEAT AND AIRFLOW PATHS, which is hereby incorporated by reference for all that is disclosed therein.

In order to enhance the cooling capacity of a heat sink device, an electrically powered fan is often mounted within or adjacent to the heat sink. In operation, the fan causes air to move over and around the fins of the heat sink device, thus cooling the fins by enhancing the transfer of heat from the fins into the ambient air. Examples of heat sink devices including fans are disclosed in U.S. Pat. No. 5,785,116 of Wagner for FAN ASSISTED HEAT SINK DEVICE and U.S. Pat. No. 5,740,013 of Roesner et al. for ELECTRONIC DEVICE ENCLOSURE HAVING ELECTROMAGNETIC ENERGY CONTAINMENT AND HEAT REMOVAL CHARACTERISTICS, which are both hereby incorporated by reference for all that is disclosed therein.

Over the years, as the power of electronic devices has increased, so has the amount of heat generated by these devices. In order to adequately cool these higher powered electronic devices, cooling devices with greater cooling capacities are required. One strategy for increasing cooling capacity is to provide a heat sink having a base portion with a surface area larger than the surface area of the electronic device being cooled. As can be appreciated, this large area base portion provides a larger radiating surface for dissipating heat into the surrounding air, and thus enhances heat removal from the heat sink. If cooling fins are used, as described above, the larger base portion also allows a greater number of cooling fins to be attached to the heat sink than would otherwise be possible.

One problem with the larger base portion heat sink described above, is that heat from the electronic device must first travel or conduct through the material forming the base portion before reaching the larger radiating surface. Although materials exhibiting relatively high thermal conductivity, e.g., aluminum and copper, are commonly used in the construction of heat sink devices, even these materials result in an undesirable level of thermal resistance which decreases the cooling ability of the heat sink device.

In order to address this problem, it is known to provide a heat pipe in association with a heat sink device. The heat pipe is generally located between the heat source being cooled and the larger radiating surface described above. Such a heat pipe generally comprises a partially evacuated chamber which includes a small quantity of working fluid, e.g., water. One wall (the heating wall) of the heat pipe is placed in contact with the heat source while another wall (the radiating or condensing wall) of the heat pipe is located adjacent the radiating surface of the heat sink. In the operation of such a device, the heat source raises the temperature of the heat pipe heating wall, causing the working fluid to vaporize. The resulting vapor then spreads rapidly throughout the heat pipe chamber, ultimately condensing on the cooler radiating wall. Thus, within the heat pipe, heat from the heating wall is transferred to the radiating wall via the latent heat of vaporization of the working fluid. Generally, the use of a heat pipe arrangement, as described above, allows heat to transfer from one surface to another more efficiently than if the heat were merely conducted through a solid material such as aluminum or copper. Examples of cooling devices incorporating heat pipe technology are described in U.S. Pat. No. 5,694,295 of Mochizuki et al. for HEAT PIPE AND PROCESS FOR MANUFACTURING THE SAME, which is hereby incorporated by reference for all that is disclosed therein.

Although the cooling devices described above generally work well in many applications, it is always desirable to further improve the efficiency and heat removal ability of cooling devices, particularly in view of the increasing cooling needs outlined above.

SUMMARY OF THE INVENTION

Disclosed herein is a cooling device for cooling heat sources, such as integrated circuits or other electronic devices during operation.

The cooling device may include a heat sink portion having a plurality of cooling vanes and a heat pipe chamber both integrally formed therewith. Because the heat pipe chamber is integrally formed with the cooling vanes, no joints exist between the condensing surface of the heat pipe chamber and the cooling vanes. This, in turn, allows extremely rapid and efficient heat transfer between the heat pipe chamber and the cooling vanes.

A separate cover portion on the heat sink serves to seal the heat pipe chamber. This separate cover portion allows the heat pipe chamber and the remainder of the heat sink to be integrally formed. The separate cover portion may be attached to the remainder of the heat sink after the remainder of the heat sink portion is formed.

The cooling device may include extensions of the main heat pipe chamber which project into one or more of the cooling vanes. In this manner, the condensing surface of the heat pipe chamber is actually extended into the vanes to a position very close to the surface of the vanes where heat transfer into the atmosphere occurs.

Also disclosed herein is a cooling device in which a separate heat pipe device is mechanically attached to a highly efficient heat sink.

DETAILED DESCRIPTION OF THE INVENTION

Figure 1:
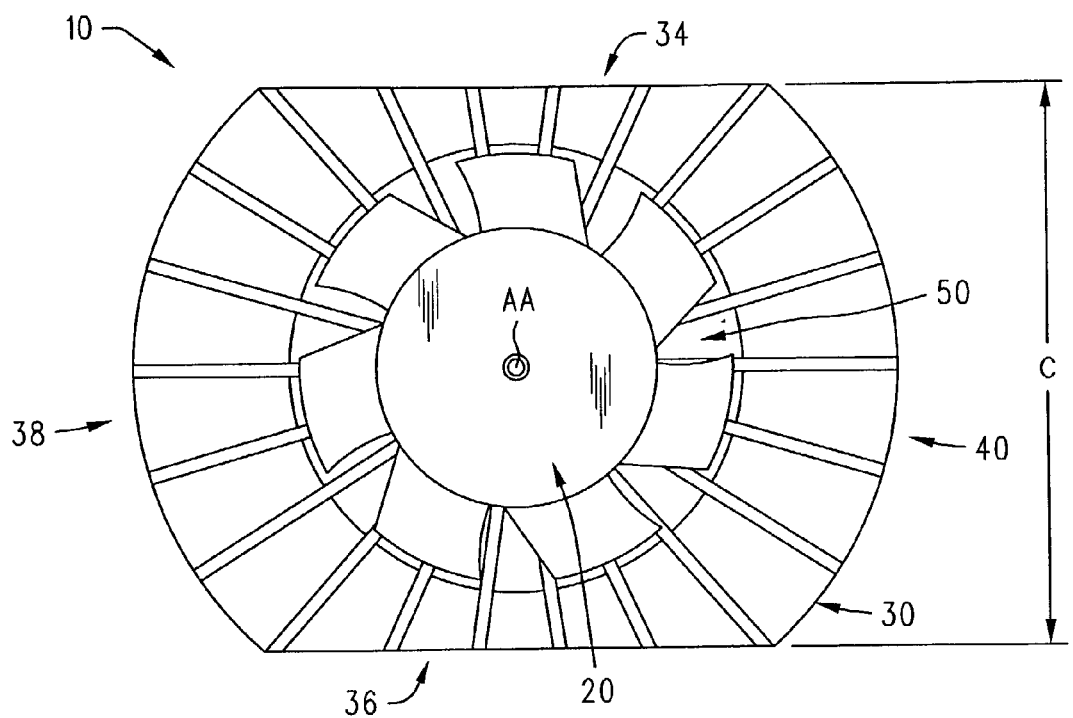
FIG. 1 is a top plan view of a cooling device mounted on a heat source, the cooling device including a heat sink and a fan operatively associated therewith.

FIGS. 1–6, in general, illustrate a cooling device 10 for dissipating heat from a heat source 26. The cooling device 10 may include a chamber 100 enclosed by at least a first wall portion 110 and a second wall portion 130. The first wall portion 110 may include a first wall portion outer surface 112 adapted to contact the heat source 26 and a first wall portion inner surface 114 oppositely disposed relative to the first wall portion outer surface 112. The first wall portion inner surface 114 may face the chamber 100. The second wall portion 130 may include a second wall portion inner surface 134 facing the chamber 100 and a second wall portion outer surface 132 oppositely disposed with respect to the second wall portion inner surface 134. A plurality of cooling vanes 80 may extend from the second wall portion outer surface 132. The plurality of cooling vanes 80 may be integrally formed with the second wall portion 130.

FIGS. 1–6 further illustrate, in general, a cooling device 10 for dissipating heat from a heat source 26. The cooling device 10 may include a chamber 100 defined by at least one wall portion 110, 130, 150 and a plurality of fins 80 extending from the at least one wall portion 110, 130, 150. The chamber 100 extends into at least one of the plurality of fins 80.

FIGS. 1–6 further illustrate, in general, a method of making a cooling device 10 including integrally forming a plurality of cooling vanes 80 into a heat sink portion 30 and integrally forming a chamber 100 within the heat sink portion 30.

Having thus described the apparatus and method in general, they will now be described in further detail.

For purposes of the description set forth herein, unless otherwise specified, certain directional terms shall, when used herein, have the meanings set forth below. The terms "radial" and "radially" are with reference to the axis B—B, e.g., FIG. 3, and generally refer to directions normal to this axis. The terms "up", "upper", "upwardly" and the like refer the direction indicated by the arrow 16, FIG. 3. The terms "down", "lower", "downwardly" and the like refer to the direction indicated by the arrow 18, FIG. 3.

It is to be understood that the above terms are defined for illustration purposes only. In actual use, the cooling device described herein may be mounted in any position, thus making terms such as "up" and "down" relative to the orientation of the cooling device.

Referring now to FIGS. 1–4, an improved cooling device 10 is illustrated. Cooling device 10 may be mounted to a heat source 26, FIG. 3, in a conventional manner for the purpose of removing heat from the heat source 26 during operation thereof. Heat source 26 may, for example, be an integrated circuit device.

Referring to FIG. 1, cooling device 10 may include a fan 20 mounted within a fan chamber 50 of a heat sink 30. The fan 20 may be rotatable about a fan rotation axis A—A. The fan 20 may be driven by a 12 volt DC brushless motor. Fan 20 may, for example, be of the type commercially available from Matsushita Electric Company of Japan, sold as a "PANAFLO" Model FBA06A12U1A (with its housing removed). Fan 20 may, for example, have a height (measured along the axis A—A) of about 25 mm and a diameter (at the tips of the fan blades) of about 57 mm.

Figure 3:
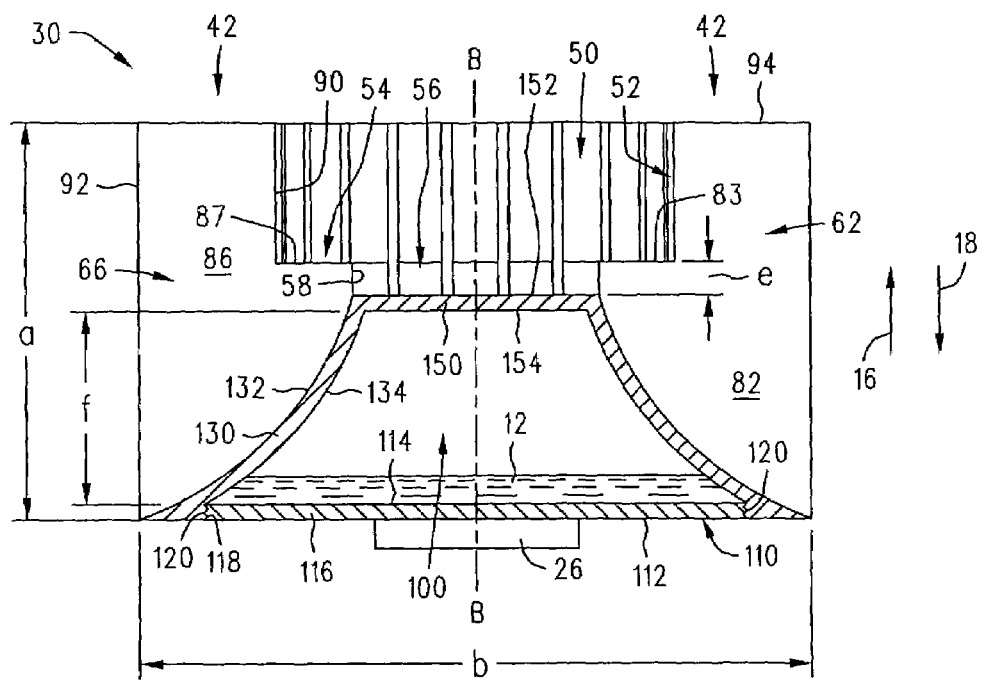
FIG. 3 is a cross-sectional elevation view taken along the line 3—3 in FIG. 2.

Referring to FIG. 3, the heat sink 30 may include a substantially planar bottom surface 112, which is adapted to contact the upper surface of a heat source, such as the heat source 26. Heat sink 30 may include a central axis B—B which may extend in a perpendicular manner relative to the bottom surface 112. When the fan 20 is installed within the heat sink 30, as illustrated, for example, in FIG. 1, the fan rotation axis A—A will be superimposed on the heat sink central axis B—B.

Figure 2:
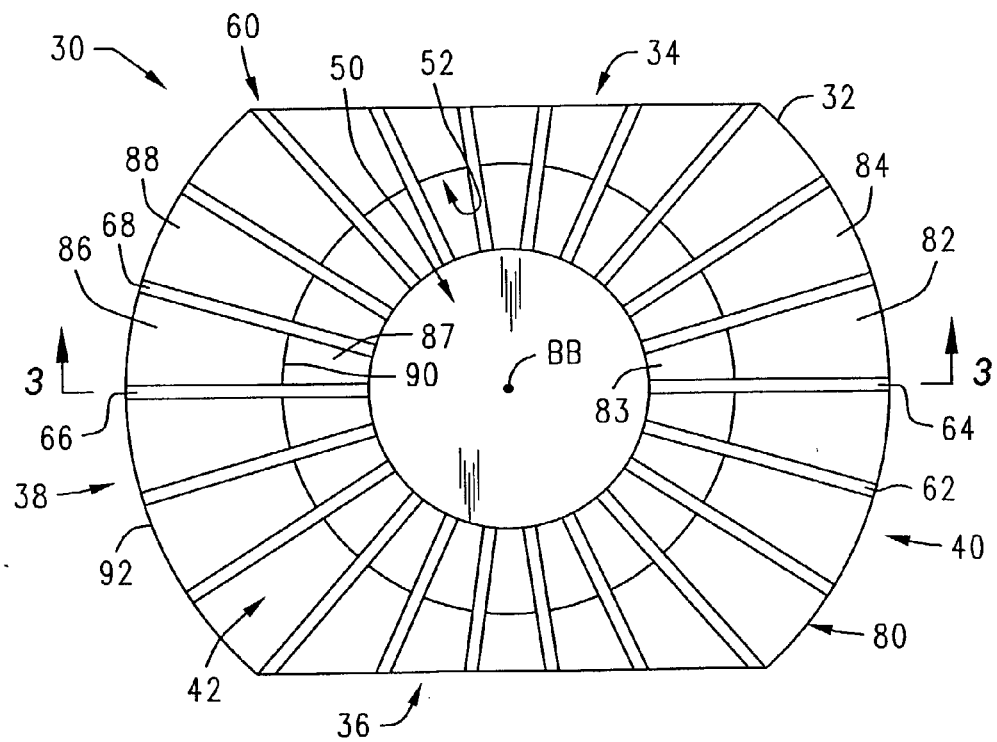
FIG. 2 is a top plan view of the heat sink of the cooling device of FIG. 1.

Referring to FIGS. 2 and 3, the fan chamber 50 may be generally cylindrical in shape and may be adapted to receive the fan 20 in a manner as shown in FIG. 1. A plurality of slots 60, such as the individual slots 62, 64, 66 and 68, may extend radially outwardly from the fan chamber 30 to the outer periphery 32 of the heat sink 30. A plurality of cooling vanes 80, such as the individual cooling vanes 82, 84, 86, 88 may also extend radially outwardly from the fan chamber 30 to the outer periphery 32. As can be appreciated, one of the cooling vanes 80 will extend between every two of the slots 60 as illustrated, for example, with reference to the cooling vane 82 extending between the slots 62 and 64 and the cooling vane 86 extending between the slots 66 and 68.

As can be appreciated, each of the cooling vanes 80 will have a radially inner face and a radially outer face. With reference to FIGS. 2 and 3, the vane 86, for example, will have a radially inner face 90 and a radially outer face 92. As can further be appreciated, the radially outer faces of all of the vanes 80 (e.g., the radially outer face 92 of the vane 86) together, form the outer periphery 32 of the heat sink 30. In a similar manner, the radially inner faces of all of the vanes 80 (e.g., the radially inner face 90 of the vane 86) together, form a generally annular "surface" 52, FIG. 1, which defines the radially outer periphery of the fan chamber 50. Outer surface 52 may be formed at a radius of about 29 mm from the heat sink central axis B—B. With reference to FIG. 2, the width of the slots 60 (as measured in a direction normal to the radial direction) may be substantially constant along their length. As a result, each of the vanes 80 may be thicker at the heat sink outer periphery 32 than at the fan chamber outer surface 52. Each of the slots 60 may, for example, have a width (as measured in a direction normal to the radial direction) of about 1.6 mm.

Referring again to FIG. 3, a portion of the slots 60 and vanes 80 may extend beneath the fan chamber 50 such that an upwardly facing edge portion of the vanes 80 (e.g., the upwardly facing edges 83, 87 of the vanes 82, 86, respectively) form a lower "surface" 54 of the fan chamber 50. A recess 56 may be formed in the fan chamber lower surface 54, as shown, in order to facilitate retention of the fan 20, FIG. 1, within the fan chamber 50 in a conventional manner.

With reference to FIGS. 1 and 2, the outer periphery 32 of the heat sink 30 may include a pair of substantially flat portions 34, 36 and a pair of arcuate portions 38, 40, as shown. The flat portions 34, 36 may be provided to facilitate fitting the cooling device 10 into a tightly confined area or to facilitate the use of multiple cooling devices in close proximity as described, for example in U.S. Pat. No. 5,740,013, previously referenced. Alternatively, the heat sink outer periphery 32 may be formed having a completely circular profile or having virtually any desired profile as dictated by the particular cooling application.

Referring again to FIG. 2, as can be appreciated, at the outer periphery 32, the vanes 80 in the arcuate portions 38 and 40 will be generally thicker than the vanes 80 in the flat portions 34, 36 due to the fact that the vanes 80 in the arcuate portions 38 and 40 have longer radial lengths than do those in the flat portions 34, 36.

With reference to FIGS. 2 and 3, the vanes 80 generally define a wall portion 42 extending between the fan chamber outer surface 52 and the outer periphery 32 of the heat sink 30. With reference to FIG. 3, heat sink 30 may, for example, have a height "a" extending between the heat sink bottom surface 112 and the upper surface 94 of the vanes 80. A width "b" may extend between the arcuate portions 38 and 40 at the outer periphery 32. A width "c", FIG. 1, may extend between the flat portions 34 and 36 at the outer periphery 32. The height "a" may, for example, be about 50 mm. The widths "b" and "c" may, for example, be about 88 mm and about 64 mm, respectively.

Referring now to FIG. 3, heat sink 30 may include a chamber 100, as shown. Chamber 100 may generally be enclosed by a first wall portion 110, a second wall portion 130 and a third wall portion 150.

Figure 4:
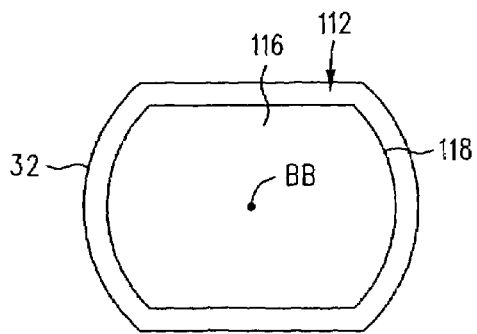
FIG. 4 is a bottom plan view of the heat sink of FIG. 2.

First wall portion 110 may include the outer bottom surface 112, previously described, and an oppositely disposed inner surface 114. As can be appreciated, the outer surface 112 will have a shape substantially identical to the shape of the heat sink outer periphery 32, FIGS. 1 and 3. First wall portion 110 may include a separate portion 116 which may be attached to the remainder of the first wall portion 110 at a joint line 118, as best shown in FIG. 4. The separate portion 116 may be attached to the remainder of the first wall portion 110 via any conventional mechanism, such as welding or brazing. In the case where the heat sink 30 is formed having a circular profile, as described above, the separate portion 116 may also have a circular configuration and, thus, may be threadingly attached to the remainder of the first wall portion 110 such that the separate portion 116 can be attached or removed from the remainder of the lower wall 110 by turning the separate portion 116 (about the axis B—B) relative to the remainder of the heat sink 30. First wall portion 110 has a thickness extending between the first wall portion outer and inner surfaces 112, 114.

Referring again to FIG. 3, second wall portion 130 may include an outer surface 132 and an inner surface 134. Second wall portion 130 may have an arcuate profile such that it extends convexly with respect to the interior of the chamber 100. Second wall portion outer surface 132 and inner surface 134 may each also have arcuate profiles as shown. Second wall portion 130 has a thickness extending between the second wall portion outer and inner surfaces 132, 134, which may, for example, be about 2 mm. As can be appreciated, second wall inner surface 134 will have a larger surface area than the first wall portion inner surface 114, described above.

Third wall portion 150 may include an outer surface 152 and an inner surface 154. Third wall portion 150 may be substantially cylindrical, having a radius (about the axis B—B), for example, of about 18 mm. Accordingly, the third wall portion outer and inner surfaces 152, 154 each have a substantially circular shape. Third wall portion 150 has a thickness extending between the third wall portion outer and inner surfaces 152, 154, which may, for example, be about 2 mm. As can be appreciated, with reference to FIG. 3, the third wall portion outer surface 152 may form a lower surface of the fan chamber recess 56 previously described. The outer surface 152 may be connected to the fan chamber lower surface 54 via a cylindrical surface portion 58, as shown. Cylindrical surface portion 58 has a height "e" which may, for example, be about 5 mm. The chamber 100 has an interior height "f" which may, for example, be about 20 mm.

Referring again to FIG. 3, a partial vacuum may be provided within the chamber 100 and a fluid 12, e.g., water, may be provided therewithin such that the chamber 100 functions as a heat pipe device. Specifically, the level of vacuum applied may be chosen such that the vaporization point of the liquid 12 is lower than the desired maximum operating temperature of the heat source 26.

In operation, the cooling device 10 may be located such that the bottom surface 112 is in contact with a heat source, such as the heat source 26. Heat generated by the heat source will, thus, be transferred to the cooling device bottom surface 112. This heat will thereafter be transferred through the first wall portion 110 to the first wall portion inner surface 114. This, in turn, will cause the fluid 12 to vaporize. The resulting vapor will then move upwardly and condense on the inner surface 134 of the second wall portion 130, which is at a lower temperature than the inner surface 114 of the first wall portion 110. Heat, thus, is rapidly transferred from the surface 114 to the surface 134 using the latent heat of vaporization of the fluid 12.

Heat transferred in this manner to the second wall portion inner surface 134 then conducts through the second wall portion 130. Thereafter, some of the heat is dissipated to the atmosphere directly from the second wall portion outer surface 132 in the area of the slots 60. The remainder of the heat continues to conduct upwardly into the fins 80 which are integrally formed with the second wall portion 130. Heat which has conducted into the fins 80 is then dissipated into the atmosphere from the fins 80. Airflow, provided by the fan 20, moves across both the fins 80 and the arcuate outer wall 132 in the area of the slots 60 to facilitate this heat dissipation. Thus, both the fins 80 and the second wall portion outer surface 132, in the area of the slots 60, serve as heat dissipation surfaces.

The chamber 100, thus, allows heat to be rapidly and efficiently transferred from a relatively small area, corresponding to the size of the heat source 26, to a relatively larger area, corresponding to the size of the second wall portion inner surface 134.

Although it is generally known to provide heat pipe devices in association with heat sinks, prior attempts generally contemplate a heat sink structure which is merely attached to a separately manufactured heat pipe chamber. A device manufactured in this manner, thus, has a joint, or interface, between the heat pipe chamber and the heat sink fins. Although the heat pipe portion tends to conduct heat very efficiently, the necessity for the heat to traverse the joint or interface between the heat pipe chamber and the cooling fins detracts from the overall efficiency of such a device.

The cooling device 10 described herein, on the other hand, is very efficient because there are no joints or interfaces between the heat pipe chamber 100 and the heat dissipation surfaces. This is a result of the fact that, the heat pipe chamber 100 is integrally formed within the heat sink structure 30.

Referring to FIGS. 3 and 4, the separate portion 116 facilitates the one-piece integral manufacture of the heat sink 30, as described above. Specifically, the heat sink 30, without the separate portion 116, may be manufactured in any conventional manner. Heat sink 30 may, for example, be formed in a typical machining operation. Alternatively, for example, heat sink 30 may be formed in a forging, molding or casting operation. The heat sink 30 may be formed from a material which conducts heat relatively well, such as aluminum or copper. After manufacture of the heat sink 30 is completed, the fluid 12 may be added to the chamber and the separate portion 116 may be attached in an air-tight manner, as previously described. Thereafter, the chamber 100 may be partially evacuated such that a partial vacuum exists therein, in a well-known manner. As can be appreciated, the provision of the separate portion 116 allows the heat pipe chamber 100 of the heat sink 30 to be integrally formed with the dissipation surfaces as described above.

As previously described, the provision of the separate portion 116 results in a joint 118 being formed in the heat sink 30. Referring to FIGS. 3 and 4, although this joint 118 is an interface, this interface does not substantially interfere with heat transfer from the heat source 26 to the dissipation surfaces. This is because heat from the heat source 26 will travel directly through the separate portion 116 to the surface 114. Thereafter, in a manner as described above, the heat may be directly transferred to the fluid 12. The heat, thus, does not need to cross the interface caused by the joint 118 in order to reach the dissipation surfaces.

The heat pipe chamber 100 may be constructed in a manner as is well known in the art. For example, the amount of fluid 12, the composition of the fluid 12 and the amount of vacuum in the chamber 100 may all be chosen according to well-known principles, as described, for example, in U.S. Pat. No. 5,694,295, previously referenced.

It is noted that the first wall inner portion 114 may be provided with a roughened surface profile in order to facilitate boiling of the fluid 12. The use of such a roughened surface is well known and is discussed, for example, in U.S. Pat. No. 5,694,295, previously referenced.

It is further noted that, when the cooling device 10 is located above the heat source to be cooled, the force of gravity is generally sufficient to cause the liquid condensed on the surface 134 to return to the surface 114. In the event the cooling device is to be located in a position other than above the heat source, however, it may be desirable to incorporate various wicking features into the construction of the chamber 100 in order to assist the condensed liquid in returning to the surface 114. Such wicking features may also be used in a case where the cooling device 10 is mounted above the heat source in order to enhance the operating efficiency of the heat pipe chamber 100. Wicking features typically involve structures or surface treatments within the chamber 100 to induce capillary action. Such wicking features are generally well-known in the art; various examples thereof are described, for example, in U.S. Pat. No. 5,694,295, previously referenced.

It is noted that the particular cooling vane configuration illustrated herein in association with the heat sink 30 is provided for exemplary purposes only. In practice, virtually any cooling vane arrangement and number could alternatively used. Heat sink 30 may, for example, be configured having angled cooling vanes as described in U.S. Pat. No. 5,785,116, previously referenced. In addition, it is noted that the fan 20 has been described herein for exemplary purposes only; the heat sink 30 could, alternatively, be of the type not incorporating a fan.

Figure 5:
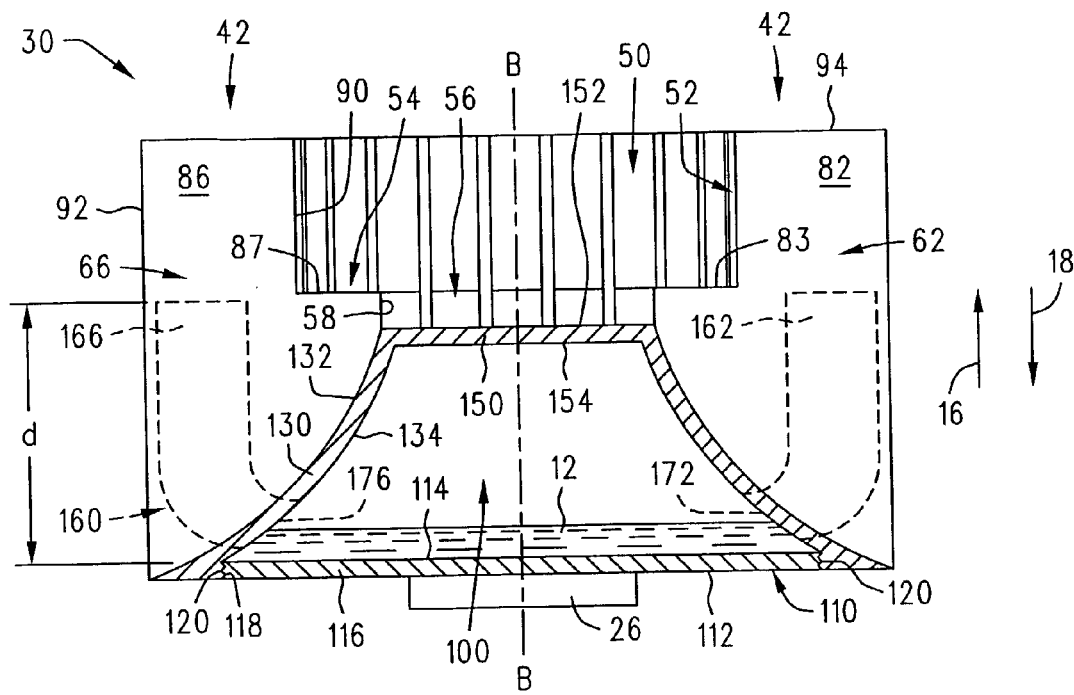
FIG. 5 is a cross-sectional elevation view, similar to FIG. 3, of another embodiment of the cooling device of FIG. 1.

FIG. 5 illustrates an alternative embodiment of the heat sink 30 of the cooling device 10. Referring to FIG. 5, a plurality of chambers 160 may be provided within the cooling vanes 80, as shown. Specifically, for example, a chamber 162 may be provided within the cooling vane 82 and a chamber 166 withing the cooling vane 86. Each of the chambers 160 may communicate with the heat pipe chamber 100 via an opening. With reference to FIG. 5, the chambers 162 and 166, for example, may communicate with the heat pipe chamber 100 via openings 172 and 176, respectively. Each of the chambers 160 may extend upwardly into the heat sink 30 for a distance "d" which may, for example, be about 30 mm.

The cooling vane chambers 160 serve to enhance the operation of the cooling device 10 by allowing the fluid 12 to actually condense within the cooling vanes 80. This causes heat to be transferred very rapidly and efficiently from the surface 114 to points close to the surface of the cooling vanes 80 where heat may be transferred into the atmosphere. It is noted that the cooling vane chambers 160 may be provided in all of the cooling vanes 80 or only in some of the cooling vanes. The chambers 160 may be formed within the cooling vanes 80, for example, by any conventional method. The chambers 160 may, for example, be formed by a machining operation. Alternatively, the chambers 160 may be molded or forged directly into the vanes 80 when the heat sink 30 is manufactured.

Figure 6:
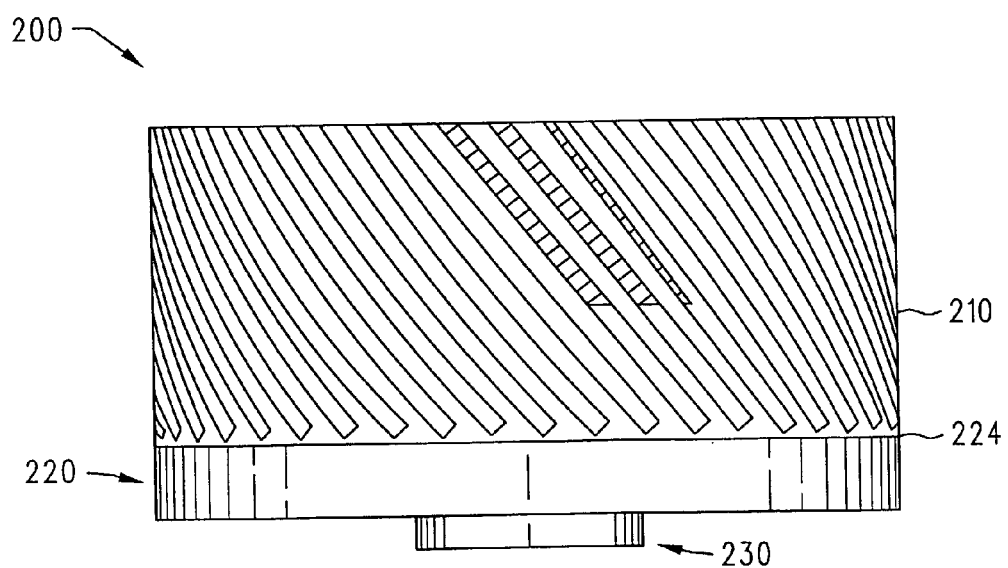
FIG. 6 is a front elevational view of another embodiment of the cooling device of FIG. 1, mounted on a heat source.

FIG. 6 illustrates a further embodiment in which a cooling device 200 include a heat sink portion 210 which is mechanically attached to a substantially cylindrical heat pipe 220. Heat sink portion 210 may be attached to the heat pipe 220 at a joint line 224 via any conventional method, such as by welding or adhesive bonding. Heat pipe 220 may be substantially similar to the heat pipe chamber 100 previously described except that the heat pipe 220 may be substantially cylindrically shaped and may be formed separately from the heat sink 210. Heat sink 210 may, for example, be substantially identical to the heat sink structure disclosed in U.S. Pat. No. 5,785,116, previously referenced.

In operation, heat from a heat source 230, which may, for example, be an integrated circuit device, transfers through the lower wall of the heat pipe 220. This heat causes the fluid, not shown, within the heat pipe 220 to vaporize. The vapor then travels to the upper interior wall of the heat pipe 220 and thereafter travels through the upper wall of the heat pipe 220. From there, the heat crosses the joint line 224 and enters the base of the heat sink 210. The heat then travels through the heat sink 210 and is dissipated into the atmosphere in a manner, for example, as described in U.S. Pat. No. 5,785,116, previously referenced. The heat pipe 220, thus, allows heat to be rapidly transferred from a relatively small area, corresponding to the heat source 230 to a relatively larger area, corresponding to the size of the base of the heat sink 210. The cooling device 200, thus, combines the advantages of a highly efficient heat sink device 210 with a heat pipe 220.

As can be appreciated, the cooling device 200 will be somewhat less efficient than the cooling device 10 previously described, due to the fact that the cooling device 200 includes a joint line 224 which must be traversed by the heat when the heat source 230 is being cooled. The cooling device 200, however, may be more easily manufactured than the cooling device 10.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A cooling device for dissipating heat from a heat source, said cooling device comprising:
    a heat pipe chamber enclosed by at least a first wall portion and a second wall portion;
    said first wall portion including:
    a. a first wall portion outer surface adapted to contact said heat source, at least a portion of said first wall portion outer surface being a planar portion;
    b. a first wall portion inner surface oppositely disposed relative to said first wall portion outer surface, said first wall portion inner surface facing said heat pipe chamber;
    said second wall portion including:
    a. a second wall portion inner surface facing said heat pipe chamber;
    b. a second wall portion outer surface oppositely disposed with respect to said second wall portion inner surface;
    a plurality of cooling vanes extending from said second wall portion outer surface, said plurality of cooling vanes being integrally formed with said second wall portion;
    a fan chamber at least partially surrounded by said plurality of cooling vanes;
    a fan at least partially located within said fan chamber, said fan having a rotation axis;
    said rotation axis being perpendicular to said planar portion of said first wall portion outer surface; and
    wherein said at least a portion of said first wall portion is releasably, threadingly attached to the remainder of said cooling device.

2. The cooling device of claim 1 wherein said second wall portion outer surface comprises a curved profile.

3. The cooling device of claim 1 wherein said first wall portion inner surface has a first surface area, said second wall portion inner surface has a second surface area and said second surface area is larger than said first surface area.

4. A cooling device for dissipating heat from a heat source, said cooling device comprising:
    a heat pipe chamber enclosed by at least a first wall portion and a second wall portion;
    said first wall portion including:
    a. a first wall portion outer surface adapted to contact said heat source, at least a portion of said first wall portion outer surface being a planar portion;
    b. a first wall portion inner surface oppositely disposed relative to said first wall portion outer surface, said first wall portion inner surface facing said heat pipe chamber;
    said second wall portion including:
    a. a second wall portion inner surface facing said heat pipe chamber; b. a second wall portion outer surface oppositely disposed with respect to said second wall portion inner surface;
    a plurality of cooling vanes extending from said second wall portion outer surface, said plurality of cooling vanes being integrally formed with said second wall portion;
    a fan chamber at least partially surrounded by said plurality of cooling vanes;
    a fan at least partially located within said fan chamber, said fan having a rotation axis;
    said rotation axis being perpendicular to said planar portion of said first wall portion outer surface;
    wherein at least a portion of said first wall portion is releasably attached to the remainder of said cooling device;
    wherein at least a portion of said first wall portion includes threads formed thereon;
    wherein at least a portion of said second wall portion comprises threads formed thereon; and
    wherein said threads formed on said first wall portion are at least partially engaged with said threads formed on said second wall portion.

5. The cooling device of claim 4 wherein said second wall portion outer surface comprises a curved profile.

6. The cooling device of claim 4 wherein said first wall portion inner surface has a first surface area, said second wall portion inner surface has a second surface area and said second surface area is larger than said first surface area.

* * * * *